United States Patent

Onodera

Patent Number: 5,693,138
Date of Patent: Dec. 2, 1997

[54] MAGNETOOPTICAL ELEMENT

[75] Inventor: Koichi Onodera, Miyagi, Japan

[73] Assignee: Tokin Corporation, Miyagi, Japan

[21] Appl. No.: 516,340

[22] Filed: Aug. 17, 1995

[30] Foreign Application Priority Data

Dec. 22, 1993 [JP] Japan ................................ 5-346485
Dec. 22, 1994 [WO] WIPO .................. PCT/JP94/02181

[51] Int. Cl.$^6$ ...................................................... C30B 1/06
[52] U.S. Cl. .................. 117/8; 117/4; 117/10; 117/957
[58] Field of Search ........................ 117/4, 8, 10, 957

[56] References Cited

U.S. PATENT DOCUMENTS

| | | | |
|---|---|---|---|
| 3,849,205 | 11/1974 | Brau et al. | 117/10 |
| 4,591,410 | 5/1986 | Ziegler | 117/957 |
| 4,863,553 | 9/1989 | Lehoczky et al. | 117/957 |
| 5,037,621 | 8/1991 | Kennedy et al. | 117/957 |
| 5,259,900 | 11/1993 | Tregilgas et al. | 117/957 |

FOREIGN PATENT DOCUMENTS

2213403  8/1989  United Kingdom .............. 117/957

OTHER PUBLICATIONS

Piotrowski, "Isothermal Growth of Homogeneous $Hg_{1-x-y}Cd_xMn_yTe$ Crystals" Journal of Crystal Growth, vol. 71 (1985) pp. 453–455.

Becla, "CdHgMnTe Light Emitting Diodes and Laser Heterostructures", J. Vac. Sci. Technology, A vol. 6(4) Jul./Aug. 1988 pp. 2725–2728.

*Primary Examiner*—Robert Kunemund
*Attorney, Agent, or Firm*—Hopgood, Calimafde, Kalil & Judlowe

[57] ABSTRACT

According to this invention, a magnetooptical element represented by $(Cd_{1-X-Y}Mn_XHg_Y)_1Te_1$ ($0<X<1$, $0<Y<1$) comprises, so as to be used in a range around each of wavelength bands of 0.98 μm, 1.017 μm, 1.047 μm, and 1.064 μm, a single crystal having a composition contained in an area defined in a quasi ternary-element phase diagram of MnTe-HgTe-CdTe by four points a, b, c, and d of:

$Mn_{0.5}Hg_{0.5}Te$, $Mn_{0.6}Hg_{0.4}Te$, $Cd_{0.83}Mn_{0.13}Hg_{0.04}Te$, and $Cd_{0.83}Mn_{0.05}Hg_{0.12}Te$, the single crystal having a thickness not smaller than 300 μm and containing substantially no twin crystal and no segregation in composition.

9 Claims, 4 Drawing Sheets

UNIT: deg/cm·Oe

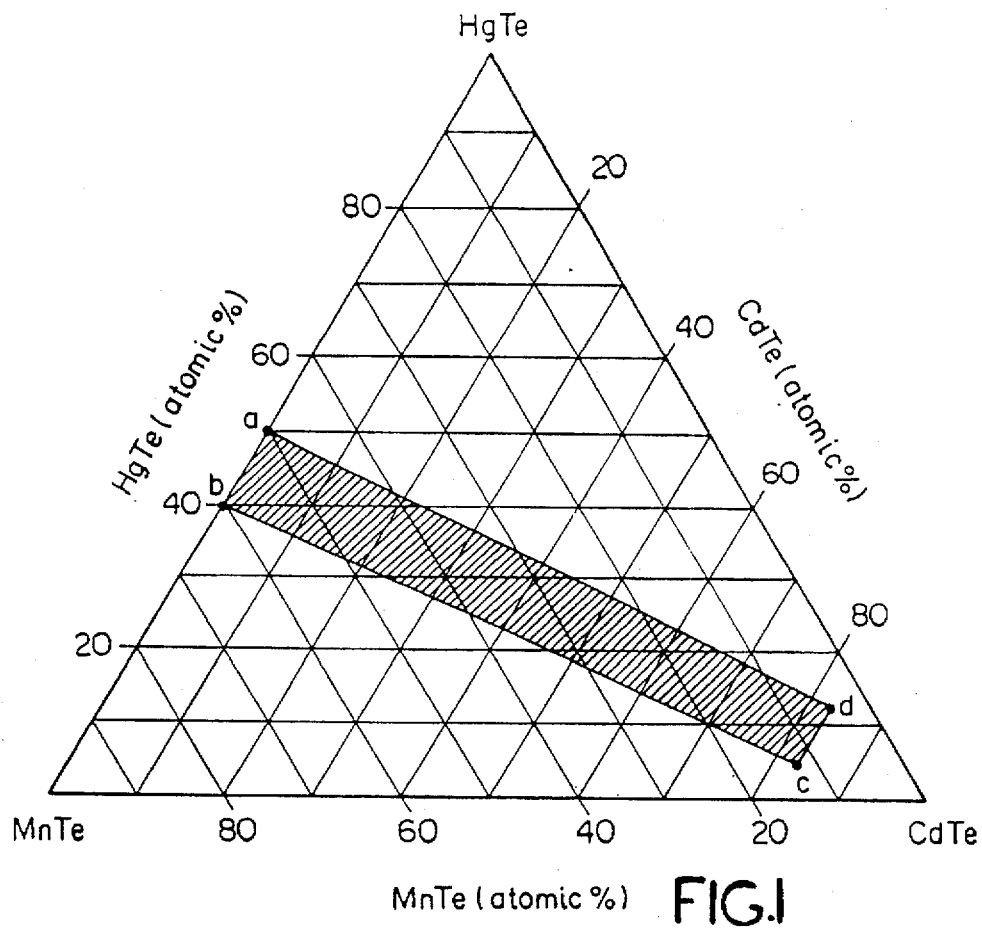
FIG.1
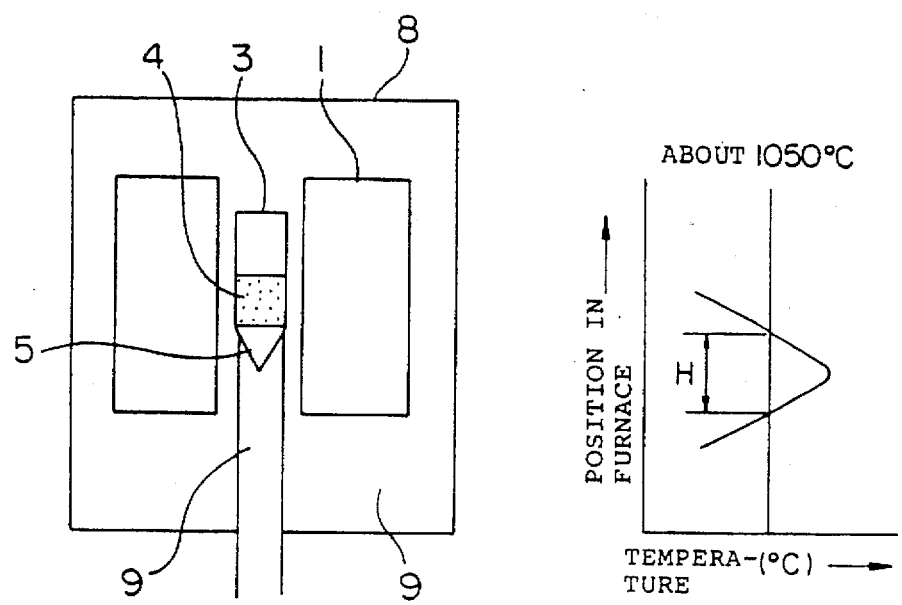
PRIOR ART
FIG.2a
PRIOR ART
FIG.2b

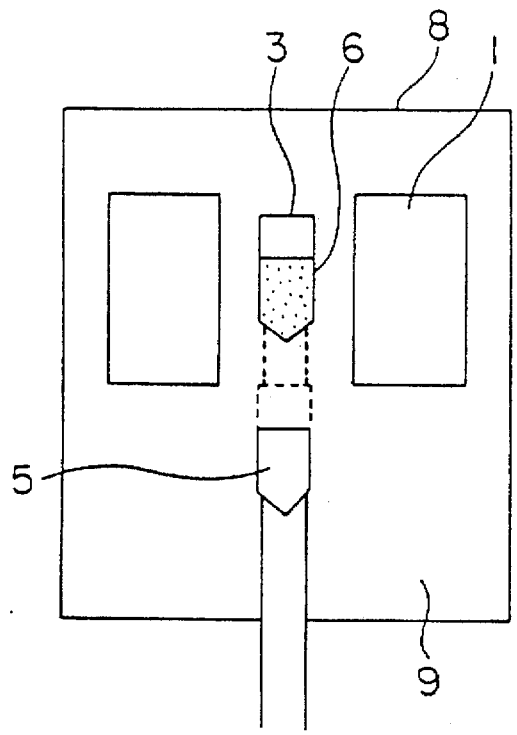
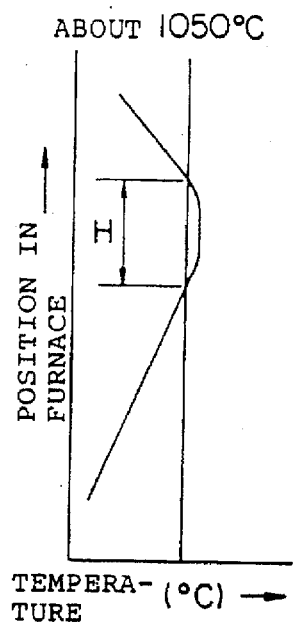
FIG.4a  FIG.4b
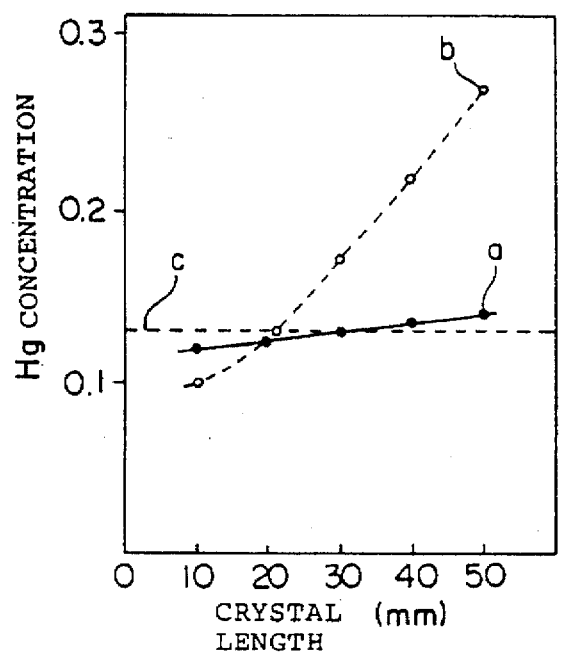
FIG.6

MAGNETOOPTICAL ELEMENT

TECHNICAL FIELD

This invention relates to a magnetooptical element which is used as a Faraday rotator in a photoreactive element and which is operable with a transmitted light beam in a wavelength range substantially equal to a 0.98 μm band, a 1.017 μm band, a 1.047 μm band, or a 1.064 μm band and, in particular, to a magnetooptical element adapted for use in an optical isolator located in the vicinity of an exciting light source (for example, a laser diode) for an optical amplifier and in an optical magnetic field sensor used in the above-mentioned wavelength range. This invention also relates to a method of manufacturing the above-mentioned magnetooptical element.

BACKGROUND ART

Recently, in an optical communication system, it is considered to use an optical fiber amplifier for directly amplifying an optical signal without conversion from the optical signal into an electric signal. In this case, the amplifier comprises an Er(erbium)-added optical fiber. The Er-added optical fiber is for transmitting a signal light beam to be amplified and an excitation light beam to obtain an amplified light beam. It has been confirmed that, when the signal light beam has a wavelength of 1.55 μm which is typically used in the optical communication system, a remarkably excellent result is obtained if the excitation light beam has a wavelength of 1.48 μm or 0.98 μm.

Particularly, the optical fiber amplifier using 1.48 μm band excitation has already been put into practical use although optical characteristics attained thereby are not excellent as compared with the optical fiber amplifier using 0.98 μm band excitation. This is because a reliable excitation laser light source has already been available in a 1.48 μm band and an optical isolator corresponding to the 1.48 μm band has already been developed also.

On the other hand, it has been experimentally confirmed that the optical fiber amplifier using 0.98 μm band exhibits higher-efficiency and lower-noise characteristics as compared with the optical fiber amplifier using 1.48 μm band excitation. However, in a 0.98 μm band, neither an excitation laser light source of a high power nor an optical isolator has been available. This has been a bar to development.

In the optical fiber amplifier using the 1.48 μm band, a Faraday rotator for the optical isolator is generally implemented by an element comprising a magnetic garnet film. However, in the 0.98 μm band, this element exhibits an extremely large insertion loss and can not practically be used. In the meantime, development of a semiconductor laser as an excitation laser light source in the 0.98 μm band is recently making a rapid progress. In this situation, attention is attracted to the optical fiber amplifier using the 0.98 μm band. Under the circumstances, there arises an increasing demand for a small-sized and low-loss optical isolator for the 0.98 μm band. It is therefore required to develop the Faraday rotator used therefor. Such a small-sized low-loss optical isolator is also required for an excitation light source (1.017 μm and 1.047 μm) of a Pr-added optical fiber amplifier responsive to a 1.3 μm signal light beam, which is very likely to be practically used in the future, and for a laser diode excitation Nd:YAG laser light source (1.064 μm) expected to be used as a transmission light source in an optical CATV.

As already known from JP-A S61-123814 (namely, 123814/1986), a ternary-element semimagnetic semiconductor material of MnTe-HgTe-CdTe is appropriate as a material exhibiting a low loss and a high Faraday rotation coefficient around each of those bands of 0.98 μm, 1.017 μm, 1.047 μm, and 1.064 μm. As regards a composition range of the above-mentioned ternary system material that exhibits a high Faraday rotation coefficient, various proposals have been made in JP-A S61-123814 mentioned above, JP-A H3-229217 (namely, 229217/1991), Japanese Patent Application No. H5-9984 filed on January 25 of Heisei 5 (1993) (see JP-A H6-222309 (namely, 222309/1994) published on August 12 of Heisei 6 (1994)), and so on.

However, all CdMnHgTe crystals described in these publications are manufactured by an MBE (molecular beam epitaxy) method or a conventional Bridgman technique. However, it is hard to say that these methods enable industrial mass-production of a uniform single crystal material.

In the MBE method, a crystal is manufactured by vapor deposition of component elements as a material onto a substrate in a vacuum. Typically, the crystal thus manufactured is as extremely thin ranging from several microns to several tens of microns. It is difficult to manufacture a Faraday element having a sufficient dimension, specifically, a thickness of at least about 300 μm, sufficient to obtain a Faraday rotation angle of 45° generally required to the optical isolator. According to this method, the crystal as manufactured often becomes a polycrystal film. Thus, it is difficult to obtain a single crystal excellent in optical uniformity for use as a material for a Faraday element.

On the other hand, according to the conventional Bridgman technique, it is possible to obtain the element of a sufficient size. However, twin crystals may be produced during manufacture. During crystal growth, fluctuation called crystal segregation may occur in its composition. Accordingly, the material as obtained generally has a non-uniform composition and an inferior optical quality. This results in decrease of a yield and in deterioration of an optical quality and characteristics of the element. Thus, this technique is not recognized as a practical method. Description will hereafter be made in detail as regards the case where a CdMnHgTe crystal (single crystal) is manufactured by the use of the conventional Bridgman technique.

When the CdMnHgTe crystal (single crystal) is manufactured by the use of the conventional Bridgman technique, a starting material is melted at a melting point not lower than a phase transformation point to produce a molten material which is then gradually cooled, as will later be described in detail. Accordingly, the phase transformation point is inevitably reached in a crystallization process by such gradual cooling, time, a twin crystal is produced. In this case, because of non-congruent melting, compositions of both the crystal and a melt liquid are varied with growth of the crystal so that a resultant crystal is different in composition from one portion to another. Thus, a crystal having a uniform composition can not be obtained.

In presence of the twin crystal, the optical quality is low in the vicinity of a boundary plane. In order to achieve practical optical characteristics as the Faraday rotator, a grown crystal must be cut in a particular direction with respect to a twin plane (typically, a direction perpendicular to the twin plane). In addition, these elements have a low optical quality and exhibit a wide fluctuation in optical characteristics because an incident light beam passes through the twin plane. Furthermore, the resultant crystal obtained by this technique exhibits a large segregation in composition (fluctuation in crystal composition). A Verdet constant and an insertion loss widely fluctuate in a crystal growth direction. As a result, only a restricted portion of the crystal as manufactured has a suitable composition range which can be used as the Faraday rotator. The above-mentioned disadvantages are inevitable if the crystal is manufactured by the conventional Bridgman technique. It is therefore desired to obtain a CdMnHgTe crystal which is free from production of a twin crystal and which has a reduced segregation in composition.

Next, description will be made as regards optical characteristics of the ternary-element semimagnetic semiconductor materials of MnTe-HgTe-CdTe disclosed in the above-mentioned publications. As compositions of the ternary-element semimagnetic semiconductor materials of MnTe-HgTe-CdTe, those composition ranges described in the above-mentioned publications are not at all appropriate to obtain excellent optical characteristics. Generally, the Faraday element is required to have two optical characteristics mentioned below. With respect to a wavelength of a transmitted light beam:

(1) To have a large Verdet constant (a Faraday rotation angle per a unit length and a unit applied magnetic field).

(2) To have a small insertion loss of the transmitted light beam.

As regards the insertion loss, a region called a cut-on wavelength where the insertion loss is drastically increased is present in a range between 0.7 and 0.9 µm. Around the region and in a shorter wavelength range, the insertion loss is too large to be used as the Faraday rotator. In the CdMnHgTe semimagnetic semiconductor, a value of the cut-on wavelength is varied in dependence upon its composition. It is therefore impossible by simple extrapolation from optical characteristic data obtained in other ranges except a target wavelength range to judge whether or not the element has the optical characteristics sufficient as the Faraday rotator in the target wavelength range in which the element is used.

Taking the above into consideration, the above-mentioned publications JP-A S61-128314 and JP-A H3-229217 will be reviewed. In the former, only three measured wavelengths of 0.8 µm, 1.3 µm, and 1.5 µm are recited in the description of embodiments. In the latter, measured wavelengths are restricted within a range between 0.50 and 0.78 µm.

Accordingly, it is impossible to apply the composition ranges described in the above-mentioned two publications as those ranges achieving excellent optical characteristics in the Faraday rotator element intended to be used in the optical isolator for the 0.98 µm band. In order to find an appropriate composition range, it is necessary to newly manufacture CdMnHgTe semimagnetic semiconductors of various compositions and to measure Verdet constants and cut-on wavelengths as optical characteristics thereof afresh in a relevant wavelength range.

In the above-mentioned patent application No. 9984/1993, the 0.98 µm band is contained in the wavelength range dealt with. However, because the applicable wavelength range is as relatively wide as 0.8 to 1.1 µm, the composition range as claimed is very narrow as compared with the case where the applicable wavelength is restricted to around 0.98 µm. Such a narrow range alone is inappropriate as a composition range of the Faraday rotator element exhibiting excellent optical characteristics for the wavelength around the 0.98 µm band.

As described above, the Faraday rotator implemented by the CdMnHgTe semimagnetic semiconductor and used in the optical isolator for the wavelength around the 0.98 µm band is required to meet the following two requirements.

(1) Means for achieving stable industrial mass-production is available.

(2) A composition range of a semimagnetic semiconductor which reduces the insertion loss of the transmitted light beam and exhibits a sufficiently large Verdet constant in the wavelength range in question is given.

However, the above-mentioned prior art publications do not specifically mention anything about each of them. In the foregoing description, the Faraday rotator implemented by the CdMnHgTe semimagnetic semiconductor is intended to be used in the optical isolator for the wavelength around the 0.98 µm band. However, the foregoing description similarly applies to the Faraday rotator for the optical magnetic field sensor using the transmitted light beam of the same wavelength.

It is therefore an object of this invention to provide a magnetooptical element having a uniform composition and an excellent optical quality and adapted to be used as a Faraday rotator.

It is another object of this invention to provide a method of manufacturing a magnetooptical element having a uniform composition and an excellent optical quality and adapted to be used as a Faraday rotator.

DISCLOSURE OF THE INVENTION

According to this invention, there is provided a magnetooptical element represented by $(Cd_{1-X-Y}Mn_XHg_Y)_1Te_1$ (0<X<1, 0<Y<1), comprising a single crystal having a composition contained in an area defined in a quasi ternary-element phase diagram of MnTe-HgTe-CdTe by four points of:

$Mn_{0.5}Hg_{0.5}Te$, $Mn_{0.6}Hg_{0.4}Te$, $Cd_{0.83}Mn_{0.13}Hg_{0.04}Te$, and $Cd_{0.83}Mn_{0.05}Hg_{0.12}Te$, the single crystal having a thickness not smaller or less than 300 µm and containing substantially no twin crystal and no segregation in composition.

According to this invention, there is also provided a method of manufacturing a magnetooptical element represented by $(Cd_{1-X-Y}Mn_XHg_Y)_1Te_1$ (0<X<1, 0<Y<1), comprising a single crystal having a composition contained in an area defined in a quasi ternary-element phase diagram of MnTe-HgTe-CdTe by four points of:

$Mn_{0.5}Hg_{0.5}Te$, $Mn_{0.6}Hg_{0.4}Te$, $Cd_{0.83}Mn_{0.13}Hg_{0.04}Te$, and $Cd_{0.83}Mn_{0.05}Hg_{0.12}Te$, the single crystal having a thickness not smaller or less than 300 µm and containing substantially no twin crystal and no segregation in composition, the method comprising the steps of:

In preparing the starting material, a material containing metal Cd, metal Mn, metal Te, and metal HgTe or a material containing metal Cd, metal Mn, metal Te, and metal Hg is mixed so that, with respect to a target composition falling within the above-mentioned area in the quasi ternary-element phase diagram, excess Te is provided and a ratio between 0.001 and 0.1 while the other elements except, for Te, are provided at a ratio substantially as specified the preparation including;

melting the starting material in an atmosphere maintained at a pressure corresponding to a vapor pressure of Hg and at a temperature sufficient to melt the starting material;

rapidly cooling and solidifying the melted material to form a polycrystal; and holding the polycrystal in an atmosphere maintained at a pressure corresponding to the vapor pressure of Hg and at a temperature lower than the phase transformation temperature of the polycrystal to recrystallize and grow the single crystal through a solid-phase reaction.

BRIEF DESCRIPTION OF THE DRAWING

FIG. 1 shows, in a quasi ternary-element phase diagram of MnTe-HgTe-CdTe, a composition range of a magnetooptical element according to one embodiment of this invention.

FIGS. 2(a) and (b) are views for describing an operation of a crystal manufacturing device for executing a conventional Bridgman technique.

FIGS. 4(a) and (b) are views for describing an operation of a crystal manufacturing device for executing a manufacturing method according to this invention.

FIG. 6 shows, in comparison, distribution of segregations in composition of the crystals manufactured by the conventional Bridgman technique and by the manufacturing method according to this invention.

MODE FOR EMBODYING THE INVENTION

Figure 3:
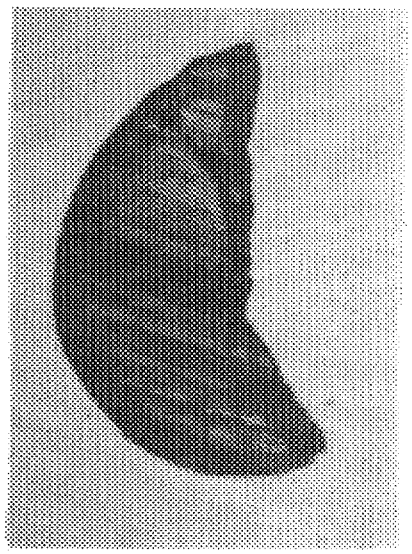
FIG. 3 is an infrared polarizing micrograph of a structure of a semimagnetic semiconductor crystal having a composition represented by CdMnHgTe and manufactured by the conventional Bridgman technique.

Next, description will be made in detail as regards an embodiment of this invention.

Referring to FIG. 1, a magnetooptical element according to one embodiment of this invention is represented by $(Cd_{1-X-Y}Mn_XHg_Y)_1Te_1$ ($0<X<1$, $0<Y<1$) and, so as to be used in a range around each of wavelength bands of 0.98 μm, 1.017 μm, 1.047 μm, and 1.064 μm, comprises a single crystal having a composition contained in an area defined in a quasi ternary-element phase diagram of MnTe-HgTe-CdTe by four points a, b, c, and d of:

$Mn_{0.5}Hg_{0.5}Te$, $Mn_{0.6}Hg_{0.4}Te$, $Cd_{0.83}Mn_{0.13}Hg_{0.04}Te$, and $Cd_{0.83}Mn_{0.05}Hg_{0.12}Te$, the single crystal having a thickness not smaller than 300 μm and containing substantially no twin crystal and no segregation in composition.

As will later be described in detail, the magnetooptical element comprising the above-mentioned single crystal is manufactured as follows, briefly speaking. Specifically, as a starting material prepared is a material containing metal Cd, metal Mn, metal Te, and metal HgTe (or a material containing metal Cd, metal Mn, metal Te, and metal Hg) mixed so that, with respect to a target composition contained in or falling within the above-mentioned area in the quasi ternary-element phase diagram, excess Te is contained by a ratio between 0.001 and 0.1 while the other elements are contained in a ratio exactly as specified. The starting material is charged in a quartz crucible. The inside of the quartz crucible charged with the starting material is maintained at a pressure corresponding to a vapor pressure of Hg. The quartz crucible charged with the starting material is placed in a uniform heating area of a heating furnace to melt the starting material. The melted material is rapidly cooled and solidified to form a polycrystal. The quartz crucible containing the polycrystalline material is moved to another area having a specific temperature gradient (which will later be described) in the heating furnace. The quartz crucible containing the polycrystal is held for several days in an atmosphere maintained at a temperature lower than a phase transformation temperature of the polycrystal and at a pressure corresponding to the vapor pressure of Hg. Finally, the above-mentioned single crystal is recrystallized and grown through a solid-phase reaction.

In this manufacturing method, a rod of a polycrystalline material having a composition substantially coincident with the target composition is prepared by a quenching process (a high-pressure melting and cooling process) and vacuum-sealed in an ampule-like crucible. By the use of a heating device, the crucible is kept at the temperature lower than the phase transformation point of the polycrystalline material for several days. Thus, the single crystal is manufactured by recrystallization and growth from the polycrystalline material. According to this manufacturing method, the above-mentioned disadvantages in the conventional Bridgman technique are removed. In other words, it is possible to mass-produce a single crystal having a high quality without production of a twin crystal and with an extremely little segregation in composition.

By the use of the magnetooptical element comprising the above-mentioned single crystal as a Faraday rotator, it is possible to obtain an optical isolator for each of wavelength bands around 0.98 μm, 1.017 μm, 1.047 μm, and 1.064 μm, which has substantially high characteristics including an isolation of at least 30 dB and an insertion loss of at most 0.5 dB and which is small in size so as to be mounted in an LD module. Likewise, by the use of the magnetooptical element comprising the above-mentioned single crystal as a Faraday rotator, it is possible to obtain an optical magnetic field sensor of a high performance which uses a transmitted light beam of the above-mentioned wavelength band.

$Cd_{1-X}Mn_XTe$ ($0<X<1$) is obtained from CdTe having a ZnS type structure by replacing a part of Cd by Mn and is known as an element having a large Verdet constant. As well known, it is used as a Faraday rotator of an optical isolator for a transmitted light beam in a wavelength range between 0.63 and 0.85 μm. However, the element has a small Verdet constant at wavelengths around 0.98 μm, 1.017 μm, 1.047 μm, and 1.064 μm bands which are objective ranges of this invention and therefore can not acquire sufficient optical characteristics as a Faraday rotator, if directly used. This is because the Verdet constant of a CdMnTe element generally increases around its cut-on wavelength, which is between 0.6 and 0.7 μm in the above-mentioned element. In order to achieve a sufficiently large Verdet constant around each of the above-mentioned bands by the use of this element, the content of Mn is varied to increase an absolute value of the Verdet constant and a part of Cd is replaced by Hg to shift the above-mentioned cut-on wavelength to a 0.9 µm band. However, in a region of the cut-on wavelength itself, the insertion loss of the element is increased and the element can not be used as a Faraday rotator. In view of the insertion loss, the cut-on wavelength is preferably equal to 0.94 µm or less in order to use the CdMnHgTe element around each of the above-mentioned bands. In this event, the insertion loss at the wavelength of 0.98 µm is not greater than 0.5 dB (a transmittance being not smaller or less than 90%). This value is so small as to be used as a Faraday rotator for an optical isolator. Final optical characteristics of the element are greatly affected by a crystallinity deciding an optical quality as a bulk element.

On the other hand, a method of manufacturing the CdMnHgTe single crystal can be improved by the manufacturing method proposed by this invention. Specifically, the rod of the polycrystalline material having the composition corresponding to the target composition is prepared by the quenching process (the high-pressure melting and cooling process) and vacuum-sealed in the ampule-like crucible. By the use of the heating device, the crucible is kept at the temperature lower than the phase transformation point of a crystal having the target composition. Thus, the single crystal is manufactured by recrystallization and growth from the polycrystalline material. In order to prevent disadvantages (distortion of the pressure against the quartz crucible, deposition of Hg, and so on) during crystal growth, preset values including the pressure, the temperature, and the temperature gradient are continuously kept appropriately. Thus, it is possible to repeatedly manufacture an element crystal of a stable composition by the same device. In the above-mentioned manner, it is possible to theoretically completely avoid production of a twin crystal which has been a great disadvantage against an optical quality in the conventional Bridgman technique. In addition, segregation in composition giving a wide fluctuation of the optical characteristics of the crystal can be suppressed to a range such that no practical problem is caused. It is thus possible to manufacture a Faraday rotator element crystal of a high optical characteristic at a high yield. Accordingly, industrial mass-production is now enabled by the above-mentioned method.

Next, a specific embodiment of this invention will be described.

Description will herein be made as regards both the conventional Bridgman technique and the manufacturing method of this invention in case where the single crystal of $Cd_{0.83}Mn_{0.13}Hg_{0.04}Te$ corresponding to a composition at the point c in FIG. 1 is manufactured.

FIG. 2 shows a structure of a manufacturing device for executing the conventional Bridgman technique. Metal Cd, metal Mn, metal HgTe, and metal Te are measured in a target ratio (Cd:Mn:HgTe:Te=0.83:0.13:0.04:0.96 in mol ratio) to be used as a starting material. Then, the starting material is charged in a quartz crucible 3. The inside of a pressure vessel 8 is vacuum-sealed in presence of an argon gas 9. The starting material is melted (conditions: a melting point of about 1050° C., a pressure of about 20 atm) in a melting zone H of an electric furnace 1 of a high-pressure Bridgman furnace into a melt liquid 4. Thereafter, the quartz crucible 3 is lowered at a rate of 3 to 7 m/hour to be cooled from its lower end. Crystal growth takes place successively from the lower end of the quartz crucible 3 to form a single crystal 5.

The crystal obtained by this technique at first has a wurtzite-type structure between the melting point (1050° C.) and a phase transformation point (950° C.) and then transformed into a sphalerite-type structure at a temperature lower than the phase transformation point. From the above, it will be understood that, according to this manufacturing technique, the resultant crystal inevitably suffers production of a twin crystal and variation of optical characteristics in a crystal growth direction due to fluctuation in composition. Thus, the resultant crystal cannot be used as a material of an optical element except a restricted portion in a particular surface orientation and in a particular region. This results in reduction of yield. Thus, this crystal has, as a region usable as a Faraday rotator, only a small portion of a whole crystal and is insufficient in quality.

FIG. 3 is an infrared polarizing micrograph of a structure of a semimagnetic semiconductor crystal manufactured by the conventional Bridgman technique. Referring to FIG. 3, a growth start portion resides on a rear side of the micrograph. The crystal is grown from there to a front side of the micrograph. In the micrograph, a stripe structure is clearly observed throughout an entire surface in an oblique direction. The stripe structure shows boundary surfaces of the twin crystals produced. An interval between every adjacent boundary surfaces, namely, a thickness of a uniform single crystal region is approximately equal to 30 µm in this case.

FIG. 4 shows a structure of a manufacturing device for executing the manufacturing method according to this invention. In case where a single crystal of $Cd_{0.83}Mn_{0.13}Hg_{0.04}Te$ corresponding to a composition at the point c in FIG. 1, hyperpure metal Cd, metal Mn, metal HgTe, and metal Te are measured in a target ratio except that Te is slightly excessively contained (excess Te is not smaller than 0.001 (namely, 0.1%) and not greater than 0.1 (namely, 10%), 0.01 (namely, 1.0%) in this embodiment, Cd:Mn:HgTe:Te=0.83:0.13:0.04:1.01 in mol ratio), and is used as a starting material. Then, the starting material is charged in the quartz crucible 3. The inside of the pressure vessel 8 is vacuum-sealed in presence of the argon gas 9. The starting material is melted (conditions: the melting point of about 1050° C., the pressure of about 20 atm) in the melting zone H of the electric furnace 1 into a melt liquid. Thereafter, the melt liquid is rapidly cooled to produce a polycrystalline sintered rod 6. Then, the quartz crucible is moved by a crucible moving mechanism to a position where the heating area has an appropriate temperature gradient (the temperature gradient of up to 10°/cm is present in a vertical direction and the temperature is lowered in a downward direction). The quartz crucible is held at a temperature (up to 880° C.) lower than the phase transformation temperature and at a pressure of about 15 atm. Recrystallization takes place to grow the single crystal 5. Since a temperature (about 900° C.) at the growth of the single crystal 5 is lower than the phase transformation point (about 950° C.), the single crystal 5 has a sphalerite-type structure from the beginning. Accordingly, the phase transformation point is not reached during the crystal cooling process. Accordingly, no twin crystal is produced. Because of the growth below the melting point, segregation in composition of the crystal is extremely small. In the crystal of the above-mentioned composition, a grown body as obtained has a single crystal region at a yield of at least 90%.

Figure 5:
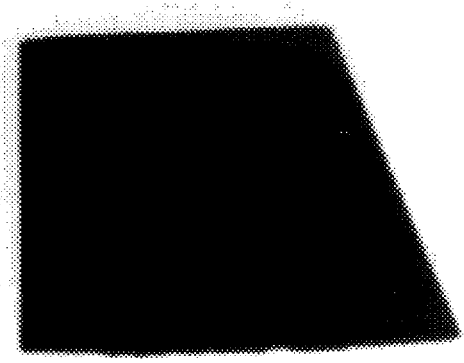
FIG. 5 is an infrared polarizing micrograph of a structure of a semimagnetic semiconductor crystal having a composition represented by CdMnHgTe and manufactured by the method according to this invention.

FIG. 5 is an infrared polarizing micrograph of a structure of a semimagnetic semiconductor crystal manufactured by the manufacturing method of this invention. Referring to FIG. 5, a growth start portion resides on a rear side of the micrograph. The crystal is grown from there towards a front side of the micrograph. Unlike the manufacture by the conventional Bridgman technique illustrated in FIG. 3, no stripe structure in a vertical direction due to production of a twin crystal is observed. This means that the optical quality is uniform.

FIG. 6 shows a Hg concentration distribution a in a longitudinal direction of the crystal grown by the above-mentioned manufacturing method of this invention and a Hg concentration distribution b in a longitudinal direction of the crystal grown by the above-mentioned conventional Bridgman technique. A target composition of the crystal is represented by c. In the figure, the Hg concentration in an ordinate corresponds to a value Y contained in a composition formula of the crystal $Cd_{1-X-Y}Mn_XHg_YTe$ (0<X<1, 0<Y<1).

Figure 7:
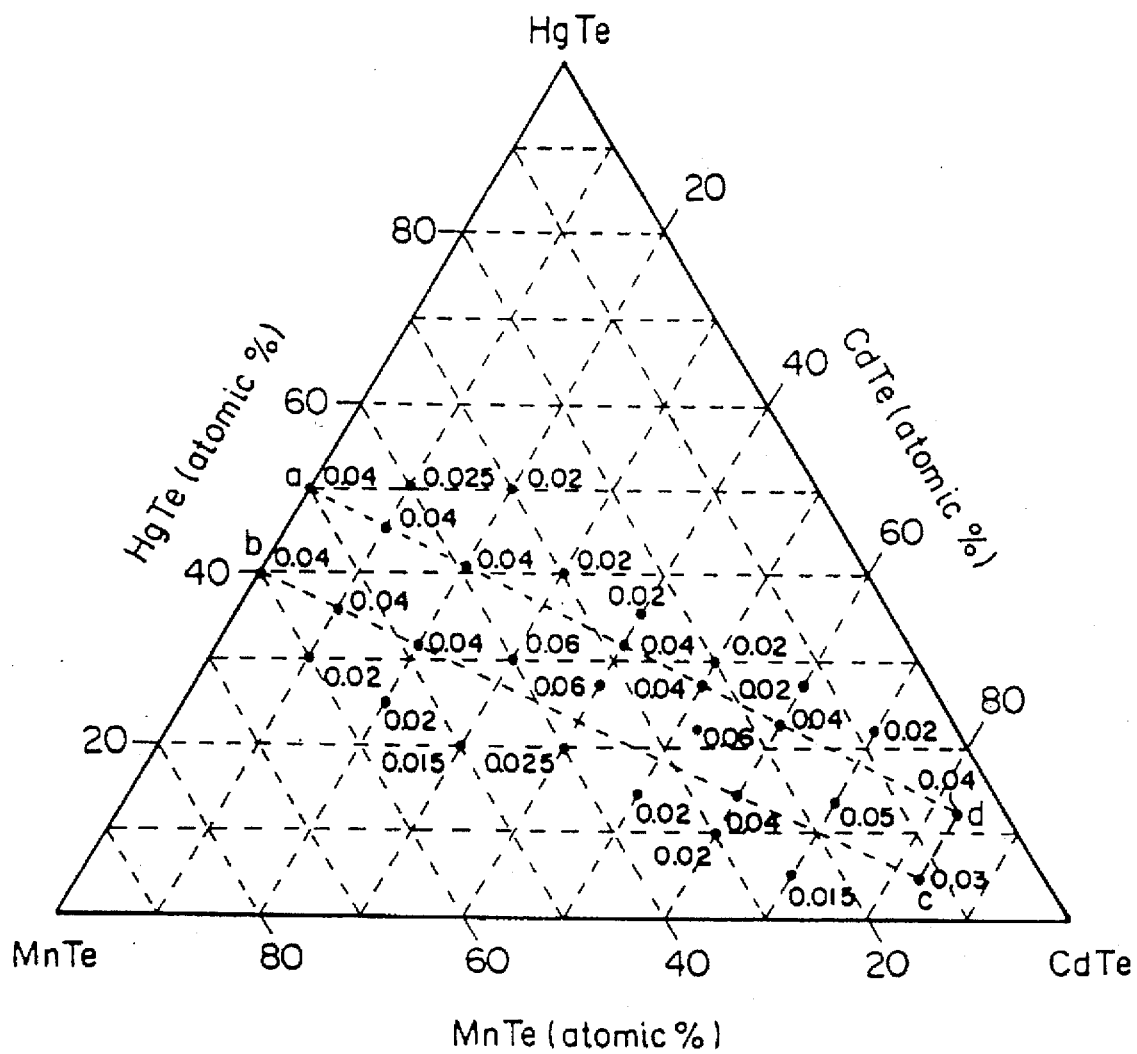
FIG. 7 shows, in a quasi ternary-element phase diagram of MnTe-HgTe-CdTe, values of a Verdet constant in the semimagnetic semiconductor single crystals of various compositions.

According to the above-mentioned manufacturing method of this invention, CdMnHgTe single crystals of various compositions in a quasi ternary-element phase diagram of MnTe-HgTe-CdTe were prepared and subjected to measurement of Verdet constants and insertion losses to seek a composition range adapted for use as a Faraday rotator. FIG. 7 shows positions of the compositions of the crystals actually manufactured and subjected to measurement of the optical characteristics, together with the values of the Verdet constants at those compositions. The number of measurement positions are equal to 30 in total as illustrated in the figure.

Generally, in case of the CdMnHgTe single crystal, it is required from conditions during use that the Faraday rotator has the Verdet constant not smaller or less than 0.03 deg/cm·Oe in a used wavelength. The reason is as follows. If a permanent magnet having a magnetic field intensity of 3000 Oe is used, the Faraday rotator has an entire length of 5 mm in order to rotate a polarization plane of the transmitted light beam by 45°. Taking into account that the optical isolator and the optical magnetic field sensor are industrially mass-produced, such a design that the permanent magnet having the magnetic field intensity of 3000 Oe is used and the entire length of the CdMnHgTe single crystal exceeds 5 mm is not practical. In view of the above, an area where the Verdet constants are not smaller than 0.03 deg/cm·Oe are illustrated in FIG. 2 by peripheral lines and an inside region of a dotted-line rectangle defined by four points a, b, c, and d in the figure. This area corresponds to the composition range surrounded by the four points a, b, c, and d in FIG. 1. In the optical characteristic of the Faraday rotator, it is important that the Verdet constant is large and the insertion loss is small. It has been confirmed that, at any point in the rectangle in the figure, the cut-on wavelength is not greater than 940 nm and the insertion loss is not greater than 0.5 dB when used as the isolator.

Description will now proceed to a specific embodiment in which the optical isolator for the 0.98 μm band was manufactured by the use of the CdMnHgTe single crystal within the composition range surrounded by the four points a, b, c, and d in FIG. 1. The $Cd_{0.83}Mn_{0.13}Hg_{0.04}Te$ single crystal having a composition corresponding to the point c in each of FIGS. 1 and 2 was prepared by the above-mentioned manufacturing method of this invention as the Faraday rotator. The Faraday rotator was inserted into an Nd-Fe-B cylindrical permanent magnet having a magnetic field intensity of 3000 Oe to be applied with a magnetic field. Thus, the optical isolator was manufactured. The Faraday rotator had a dimension of 1.7 mm×1.7 mm×5 mm. A light transmitting region was subjected to 0.98 μm nonreflection coating on opposite surfaces thereof. As a polarizing element, use was made of two glass polarizers subjected to similar nonreflection coating are used. The dimension of the optical isolator was as small as φ 8 mm×8 Lmm. As regards the optical characteristics, the isolation was 30 dB and the insertion loss was 0.5 dB. These values are sufficient for use as a 0.98 μm band optical isolator for an optical fiber amplifier.

On the other hand, when the crystal manufactured by the conventional Bridgman technique is used, the 0.98 μm band optical isolator of a similar structure has the characteristics including the isolation of 25 dB and the insertion loss of 1.0 dB which are extremely insufficient for practical use, even if a crystal portion of a best quality is used.

EFFECT OF THE INVENTION

As described above, according to this invention, it is possible to provide the magnetooptical element comprising the semimagnetic semiconductor crystal having a composition represented by $Cd_{1-X-Y}Mn_XHg_YTe$ (0<X<1, 0<Y<1) and adapted for use in the optical isolator used in the amplifier exciting light source (0.98 to 1.064 μm) and so on.

According to this invention, there is also provided the method of efficiently manufacturing the above-mentioned semimagnetic semiconductor as the single crystal having a high quality without production of the twin crystal and with a sufficiently small segregation in composition.

According to this invention, by the use of the above-mentioned magnetooptical element as the Faraday rotator, the small-sized and high-efficiency optical isolator is obtained which is adapted for use in the amplifier exciting light source (the 0.98 μm band, the 1.017 μm band, the 1.047 μm band, and the 1.064 μm band).

According to this invention, there is also provided a high performance optical magnetic field sensor using the above-mentioned magnetooptical element as the Faraday rotator and operable at the used wavelength of the 0.98 μm band, the 1.017 μm band, the 1.047 μm band, and the 1.064 μm band.

I claim:

1. A magnetooptical element composition represented by the formula $(Cd_{1-X-Y}Mn_XHg_Y)_1Te_1$ (0<X<1, 0<Y<1), and comprising a single crystal having a composition defined by an area shown in FIG. 1 of the drawing of a quasi ternary-element phase diagram of MnTe-HgTe-CdTe, said area being defined as follows:

$Mn_{0.5}Hg_{0.5}Te$;

$Mn_{0.6}Hg_{0.4}Te$;

$Cd_{0.83}Mn_{0.13}Hg_{0.04}Te$;

and $Cd_{0.83}Mn_{0.05}Hg_{0.12}Te$;

said single crystal having a thickness of not less than about 300 μm and being substantially free of twin crystals and substantially free of segregation.

2. A magnetooptical element as claimed in claim 1, said element being used in a wavelength range substantially equal to a 0.98 μm band.

3. A magnetooptical element as claimed in claim 1, said element being used in a wavelength range substantially equal to a 1.017 μm band.

4. A magnetooptical element as claimed in claim 1, said element being used in a wavelength range substantially equal to a 1.047 μm band.

5. A magnetooptical element as claimed in claim 1, said element being used in a wavelength range substantially equal to a 1.064 μm band.

6. An optical isolator comprising as a Faraday rotator a magnetooptical element as claimed in claim 1.

7. An optical magnetic field sensor comprising as a Faraday rotator a magnetooptical element as claimed in claim 1.

8. The magnetooptical element as claimed in claim 1, wherein the composition of said magnetooptical element as defined in the area shown in FIG. 1, is capable of use in a wavelength range substantially equal to one of the wavelength bands selected from the group consisting of 0.98 μm band, 0.017 μm band, 1.047 μm and 1.064 μm band.

9. A method of manufacturing a magnetooptical element represented by formula $(Cd_{1-X-Y}Mn_XHg_Y)_1Te_1$ ($0<X<1$, $0<Y<1$), and comprising a single crystal having a composition contained or falling within an area shown in FIG. 1 of the drawing of a quasi ternary-element phase diagram of MnTe-HgTe-CdTe by four points as follows:

$Mn_{0.5}Hg_{0.5}Te$;

$Mn_{0.6}Hg_{0.4}Te$;

$Cd_{0.83}Mn_{0.13}Hg_{0.04}Te$;

and $Cd_{0.83}Mn_{0.05}Hg_{0.12}Te$;

said single crystal having a thickness of not less than about 300 μm and being substantially free of twin crystals and segregation, said method comprising the steps of:

preparing as a starting material a material containing metal Cd, metal Mn, metal Te, and metal HgTe or a material containing metal Cd, metal Mn, metal Te, and metal Hg mixed so that, with respect to a target composition contained or falling within the above-mentioned area in the quasi ternary-element phase diagram shown in FIG. 1 of the drawing, excess Te is contained by a ratio between 0.001 and 0.1 while the remaining elements, with the exception of Te, are contained in a ratio substantially as specified;

forming a melt of said starting material in an atmosphere maintained at a pressure corresponding to the vapor pressure of Hg and at a temperature sufficient to melt said starting material;

rapidly cooling and solidifying said melted material to form a polycrystal; and holding said polycrystal in an atmosphere maintained at a pressure corresponding substantially to the vapor pressure of Hg at a temperature lower than the phase transformation temperature of said polycrystal and thereby recrystallize and grow said single crystal through a solid-phase reaction.

* * * * *